United States Patent [19]

Waller, Jr.

[11] Patent Number: 4,538,297

[45] Date of Patent: Aug. 27, 1985

[54] AURALLY SENSITIZED FLAT FREQUENCY RESPONSE NOISE REDUCTION COMPANSION SYSTEM

[76] Inventor: James Waller, Jr., 9901 Allen Rd., Clarkston, Mich. 48016

[21] Appl. No.: 521,144

[22] Filed: Aug. 8, 1983

[51] Int. Cl.³ .............................................. H04B 1/64
[52] U.S. Cl. ...................................... 381/94; 381/106; 333/14
[58] Field of Search .................... 381/94, 106; 333/14; 455/72

[56] References Cited

U.S. PATENT DOCUMENTS 4,430,754  2/1984  Ishigaki ................................. 455/72
4,449,106  5/1984  Ishigaki et al. ................. 381/106 X

*Primary Examiner*—Gene Z. Rubinson
*Assistant Examiner*—James L. Dwyer
*Attorney, Agent, or Firm*—Frank J. Catalano

[57] ABSTRACT

A flat frequency response compansion noise reduction system employs both input signal and control signal preemphasis and deemphasis in its encoder and decoder networks respectively. The linear range of the frequency response curve of the input signal deemphasis is selected to approximate the frequency range within the audio spectrum at which the human ear is most sensitive, typically having a high frequency end of 3.617 kHz. The frequency response curve of the input signal preemphasis is a mirror image of the frequency response curve of the input signal deemphasis. The linear range of the frequency response curve of the control signal preemphasis is selected to provide an encoder output signal having a substantially flat response. The frequency response curve of the control signal deemphasis is a mirror image of the frequency response curve of the control signal preemphasis. The amount of preemphasis is maximized to the limits of the recording medium, typically ranging from 0 db to 20 db.

14 Claims, 6 Drawing Figures

AURALLY SENSITIZED FLAT FREQUENCY RESPONSE NOISE REDUCTION COMPANSION SYSTEM

BACKGROUND

This invention relates generally to audio signal noise reducing systems and more particularly concerns signal compression and expansion systems.

The use of compansion techniques in noise reduction is commonly known. Channel noise is frequently reduced by compression of the dynamic range of the incoming signal by a 2 to 1 linear decibel ratio. This permits easy passage of an incoming signal of wide dynamic range through a medium of relatively restricted dynamic range. Such media include recording tapes, telephone lines, phonograph records and the like. As a result of compression, the noise floor of the medium is effectively lowered or, conversely, the signal level intensity is increased in relation to the medium noise floor. Thus, the noise level is masked by the signal level. The signal is then expanded by a 1 to 2 ratio restoring the full dynamic range of the original signal and reducing channel noise.

One of the problems with this type of system is that modulation of the noise floor within the transmission medium by the audio signal restricts the clarity or purity of the audio signal. This modulation, when resulting from low frequency tones having fast rise and rapid decay produces accentuated problems in the absence of high frequency components which would mask the modulation noise. This is commonly referred to as "breathing" or "hiss".

It is known that this problem can be reduced by use of split band or multiple band companding systems, but such systems are complex and produce frequency response and phase errors.

It is also known that noise modulation effects can be reduced by the use of preemphasis in the audio signal path which boosts high frequency content during compression and by the use of complimentary deemphasis during expansion which reduces high frequency noise. But most systems do not have sufficient transmission channel headroom to accomplish this. Consequently, a known method of detection preemphasis employs a detection circuit which weighs high frequency tones more than low, thus reducing headroom requirements and overload problems. But this detection preemphasis has been used only in conjunction with relatively low levels of signal path preemphasis to avoid the common problem of high level, high frequency tape saturation experienced with magnetic recording tape.

SUMMARY

In view of these existing limitations, this invention provides a noise reduction system which, among its objectives, takes greater advantage of the masking effect, provides more effective noise reduction in the presence of low frequency signals and otherwise minimizes distortion resulting from noise modulation.

In accordance with the invention, a flat frequency response noise reduction compansion system is provided in which the linear range of signal preemphasis falls in a frequency range preselected to most effectively match aural sensitivity to audio frequencies. And the decibel limits are selected to provide greater signal preemphasis and deemphasis levels than previously employed, thus providing more effective masking. Additionally, the attack and recovery times of the compression and expansion gain control signals are equalized and minimized to further reduce noise and harmonic distortion. The combination of selective preemphasis and deemphasis matched to aural sensitivity, the use of greater levels of preemphasis and deemphasis, and the minimization and equalization of gain control attack and release time substantially reduces the effect of noise modulation and coloration to an inaudible amount.

BRIEF DESCRIPTION OF THE DRAWINGS

Other objects and advantages of the invention will become apparent upon reading the following detailed description and upon reference to the drawings in which.

DETAILED DESCRIPTION

Figure 1:
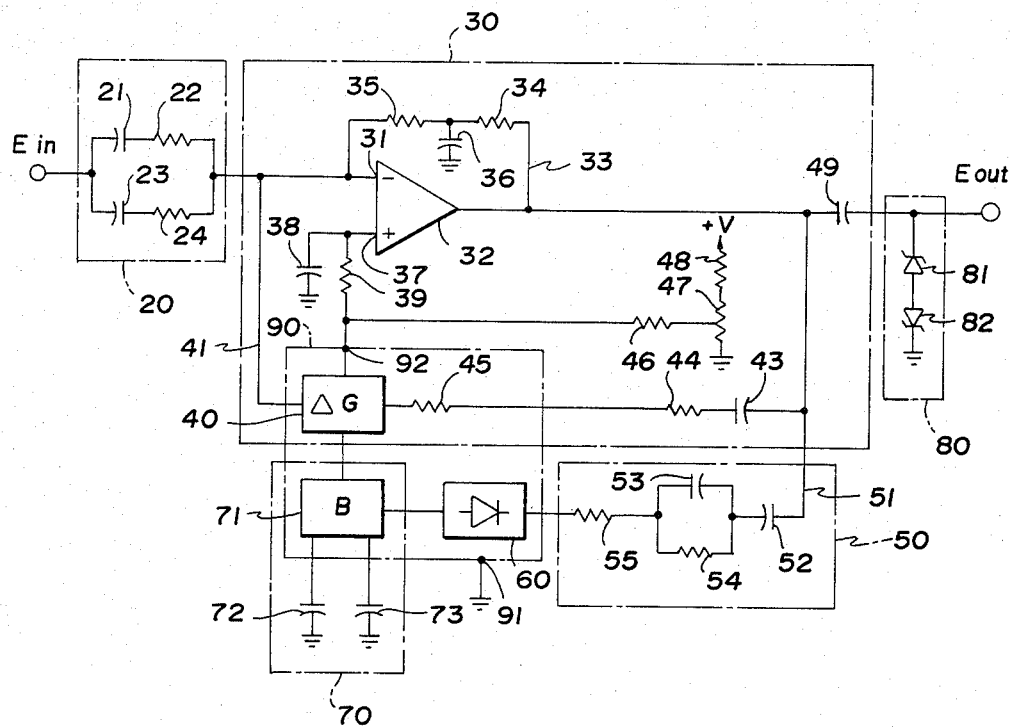
FIG. 1 is a schematic diagram of an embodiment of the encoder of the present invention.

The schematic diagram of the encoder of the preferred compansion system is illustrated in FIG. 1. It consists of a signal preemphasis network 20 in which input audio frequency signals $E_{in}$ of lower frequency are attenuated more than higher frequency, thereby emphasizing the signals of higher frequency. Since the emphasis is greater for signals at higher frequencies, this will be referred to as direct preemphasis. The emphasized signal is fed to the compressor 30 where it is amplified at a 2 to 1 ratio. This amplified signal is then fed to the control or detector preemphasis network 50 where signal attenuation increases as the frequency increases, thereby emphasizing low frequency signals. Since the emphasis is greater for lower frequencies than higher frequency signals, this will be referred to as inverse preemphasis. The inversely preemphasized signal is fed to a full wave rectifier 60 which provides a D.C. control signal which varies the gain of the compressor 30. This will be explained in more detail hereinafter. Preferably the D.C. control signal will first be preconditioned by a buffer network 70 which is used to minimize the noise and harmonic distortion which results from the reaction of the components of the compressor 50 to rapid increase and decline in the D.C. control current. Finally, the encoder may include a limiter network 80 which eliminates the possibility of the output signal $E_{out}$ exceeding the recording medium head room by clipping attack time transients from the output $E_{out}$.

Figure 2:
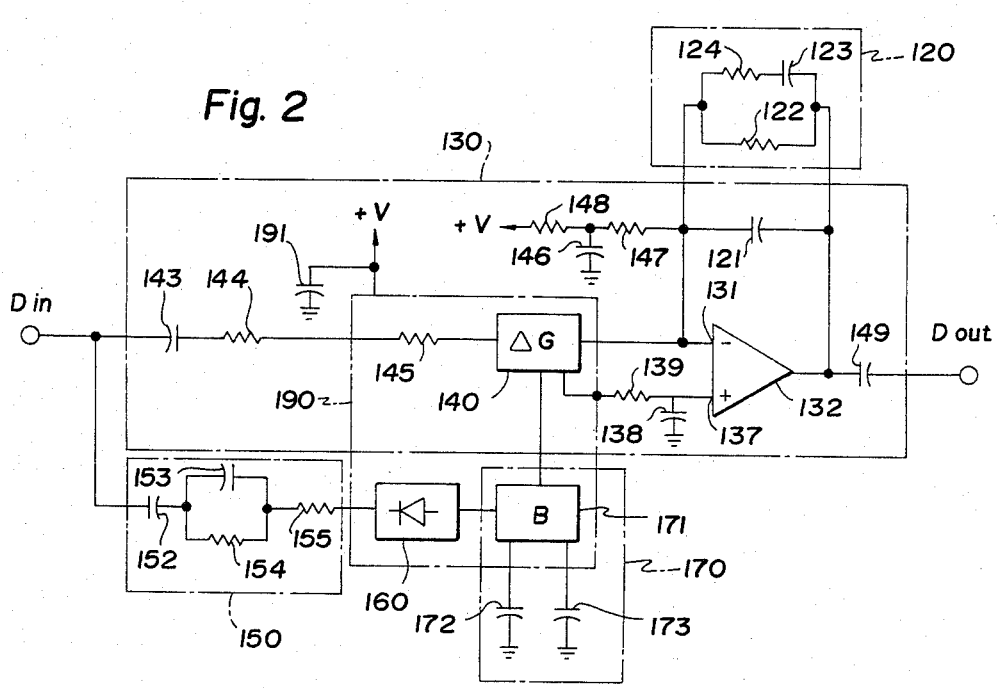
FIG. 2 is a schematic diagram of an embodiment of the decoder of the present invention.

Turning now to FIG. 2, the decoder of the preferred compansion network can be seen to reverse the process of the encoder. Thus, the input signal to the decoder $D_{in}$ is fed to the control or detector deemphasis network 150 where, opposite to the function of the counterpart control or detector preemphasis network 50, signals at lower frequency are more greatly attenuated than those at higher frequency, thus deemphasizing the lower frequency signals. Since the net result is that lower frequency signals are deemphasized, this will be referred to as direct deemphasis. The directly deemphasized signal is fed to full wave rectifier 160 which varies the gain of the expander 130. As in the case of the encoder, this D.C. control signal will preferably be preconditioned by the buffer network 170 prior to use in gain control. The input signal $D_{in}$ is also fed to the expander 130 where it is amplified at a 1 to 2 ratio in variable response to the D.C. control current from the rectifier 160. The output of the expander 130 is fed to the signal deemphasis network 120. In the signal deemphasis network 120, high frequency signals are more greatly attenuated than low, therefore deemphasizing the higher frequency signals. Since the higher frequency signals are more greatly deemphasized, this will be referred to as inverse deemphasis. The inversely deemphasized signal is fed back to the expander 130, the output of which is the decoder output signal $D_{out}$.

The above general description of the preferred embodiments of the encoder and decoder, including the signal preemphasis network 20, the compressor 30, the detection preemphasis network 50, the D.C. control network 60, the detection deemphasis network 150, the expander 130, the D.C. control network 160, and the signal deemphasis network 120, taken together, provide an output signal having suitable dynamic range but subject to undesirable noise and distortion. Furthermore, variations in output frequency response increase headroom requirements within the medium. And in systems in which incoming signals are encoded at one frequency for decoding at a different frequency, flat response is critical. Therefore, the characteristics of the components will now be determined so as to provide a desired flat frequency response at the encoder output $E_{out}$. Any variation from an absolute flat frequency response at $E_{out}$ will, of course, be amplified by the gain of the decoder expander 130. So a substantially flat frequency response at $E_{out}$ is critical to a substantially flat frequency response at $D_{out}$, thereby producing a more suitable reproduction of the input signal $E_{in}$ even when the medium has provided an output signal of different frequency.

In addition to the benefits of an improved flat frequency response, listenability can also be greatly enhanced by selecting network components which provide preemphasis of the signal in a range which is carefully preselected to match the aural sensitivity range of the human ear.

Figure 3:
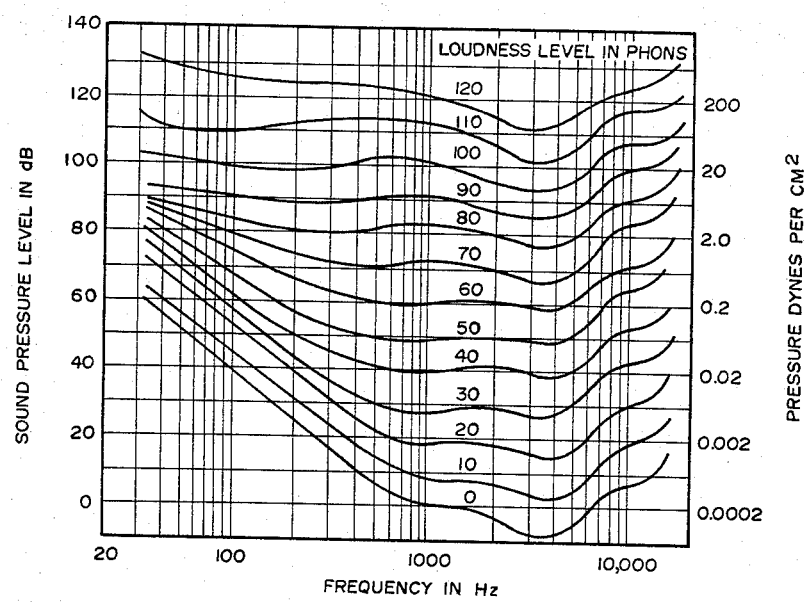
FIG. 3 illustrates the sensitivity of the human ear to sounds of various accoustic levels and frequencies.
Figure 4:
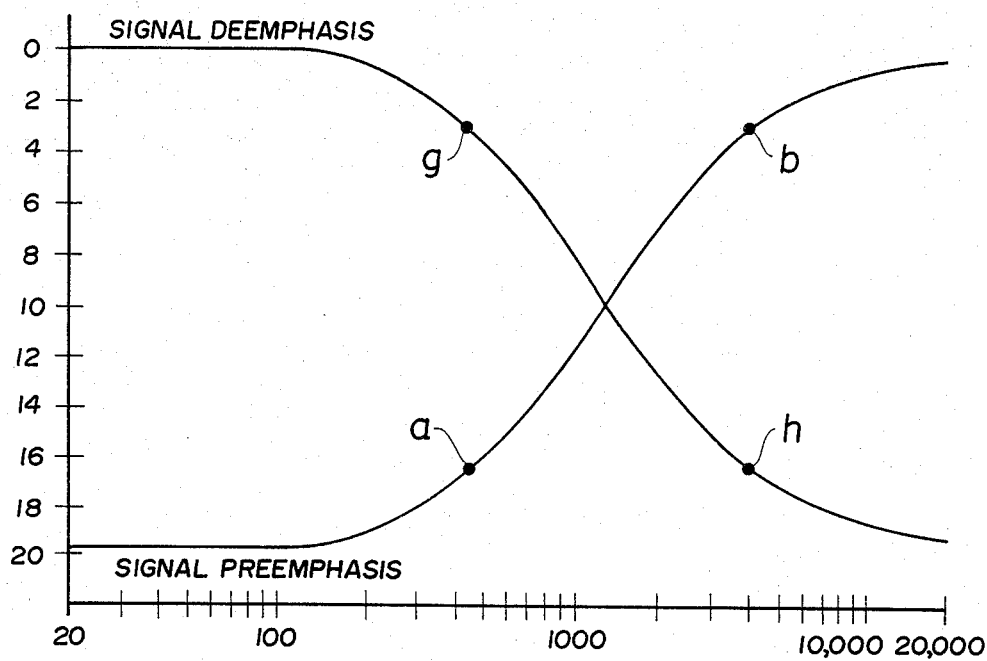
FIG. 4 illustrates the complimentary frequency response curves of the signal preemphasis network of the encoder of FIG. 1 and the signal deemphasis network of the decoder of FIG. 2 for specific values of network components.

FIG. 3 illustrates the sensitivity of the human ear over the audio frequency spectrum. It can be noted that the acoustic level of sound energy is not accurately sensed by the human ear. For example, consider two pure tones at 4 kHz and 50 Hz. If the 4 kHz tone has a sound pressure level of 60 db, in order for the ear to perceive both tones to be of equal intensity, the 50 Hz tone would require a sound pressure level of 80 db, or a difference of 20 db. The curves in the figure are known as equal loudness curves or Fletcher Munson Curves and are described in more complete detail in *Audio Cyclopedia*, 2nd Edition. Study of the curves shows that the sensitivity of the human ear is greatest in the range of 2 to 6 kHz and, in fact, sensitivity peaks between 3 and 4 kHz, specifically at about 3.617 kHz. That is, as audio frequency increases beyond 3.617 kHz, the ear's sensitivity to sound begins to decay fairly rapidly. Consequently, it is desirable to coordinate the compansion network components so that signal level variations are greatest over the maximum frequency range up to a maximum of 6 kHz and preferrably 3.617 kHz. This can be accomplished by selecting suitable components in the signal deemphasis network 120 which will provide a frequency response curve having a corner frequency in the range of 2 to 6 kHz and preferably 3.617 kHz. A signal deemphasis frequency response curve having a corner frequency of 3.617 kHz of course mandates the use of a mirrored curve in the signal preemphasis network which it compliments. FIG. 4 illustrates a desirable signal deemphasis network frequency response curve as well as the mirrored signal preemphasis network frequency response curve which is required as its compliment. These curves represent the responses derived from the signal preemphasis network 20 and signal deemphasis network 120 in the preferred compansion network having components of values hereinafter shown in Tables 1 and 2.

It can also be seen that an increase in the range of levels of attenuation will increase the effectiveness of the compansion network. Therefore, it is further beneficial to interrelate the components so that, having established the high frequency corner frequency, the low frequency corner frequency will provide as great a level range as the medium will allow, thereby obtaining maximum frequency range along the asymptotic linear slope of the frequency response curves.

Given the signal preemphasis frequency response curve for the signal preemphasis network 20 of the encoder, the characteristics of the detection preemphasis network can then be coordinated to provide the benefits of a flat frequency response in encoder output $E_{out}$. The choice of corner point affects the maximizing of both the desired flat frequency response and the benefits of the second stage of preemphasis. A detector preemphasis network frequency response curve having a corner frequency of 3.15 kHz has been found to be suitable when coordinated with a corner frequency of 3.617 kHz in the signal preemphasis network. While these relative corner frequencies provide suitable results, greater displacement will reduce the effectiveness while bringing these frequencies closer to coincidence, improves effectiveness.

Figure 5:
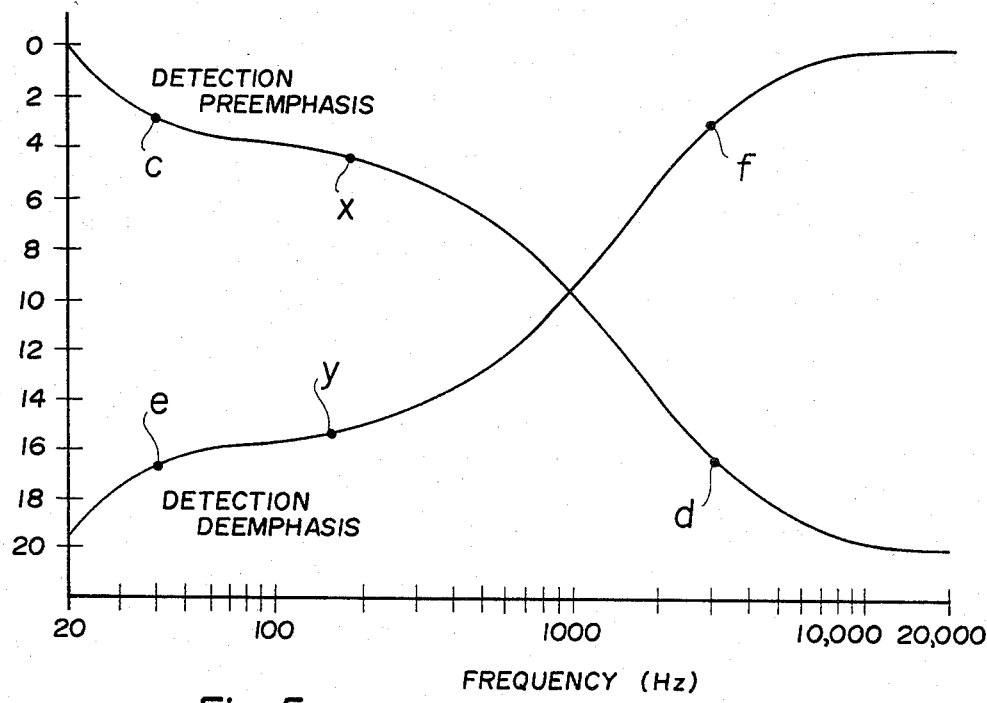
FIG. 5 illustrates the complimentary frequency response curves of the detection preemphasis network of the encoder of FIG. 1 and the detection deemphasis network of the decoder of FIG. 2 for specific values of network components.

Turning to FIG. 5, the frequency response curve of the detector preemphasis network 50 having a corner frequency of 3.2 kHz is illustrated along with the detector deemphasis frequency response curve of the detector deemphasis network 150 which compliments it. As in FIG. 4, these curves represent the responses derived from these networks in the preferred compansion network having components of values hereinafter as shown in Tables 1 and 2.

It can be seen, therefore, that by appropriate selection of the corner frequency of the frequency response curve of the signal deemphasis network 120 and coordination of the corner frequency of the detection preemphasis network 50 with the corner frequency of the signal preemphasis network 20, the desired reduction of noise and distortion in the output signal $D_{out}$ can be obtained. Imposing these conditions on the decoder signal deemphasis network 120 and on the encoder detector preemphasis network 50 requires that complementary interrelationships be imposed on network counterparts within the compansion network. Thus the values of all the basic elements of the compansion network can now be determined. In addition to the improvements in noise and distortion reduction obtainable by the use of the above-described component matching, further benefits can be gained by additional modifications within the system. For example, it is apparent that the gain of the compressor 30 is determined by the D.C. control signal derived from the output of the detection preemphasis network 50. As a result, infrasonic frequencies passed through the detection preemphasis network 50 would cause the compressor 30 to track signals not recordable by the medium, thereby permitting unnecessary passing of unmasked noise. This can be avoided by the introduction of a lowcut filter in the detection preemphasis network to block reflection of signals of infrasonic frequency in the gain control signal.

Furthermore, rapid rise and decay of the D.C. signal controlling the gain also has undesirable effects. That is, a rapid increase in the control current will produce harmonic distortion due to rapid changes in the compressor 30, and a slow decay time of the control current will cause the expander 130 to function in the absence of any signal other than the noise floor of the system, resulting in the amplification of the unmasked noise.

Keeping these things in mind, and returning to FIG. 1, a more detailed explanation of the encoder and all of its components can now be given. The input audio signal $E_{in}$ to the encoder is fed to the signal preemphasis network 20. The signal preemphasis network 20 consists of the capacitor 21, which serves only as an A.C. coupler, connected in series with resistor 22, which determines the low frequency 3 db point or corner frequency of the signal preemphasis network 20 shown at point a in FIG. 4. Connected in parallel with the series connected capacitor 21 and resistor 22 are the series connected capacitor 23 and resistor 24. In combination capacitor 23 and resistor 24 determine the high frequency 3 db point or corner frequency of the signal preemphasis network 20 shown at point b in FIG. 4. Thus, it can be seen that the signal preemphasis network 20 is a single pole filter, providing a signal preemphasis frequency response curve having a slope of approximately 6 db per octave between its high and low corner frequencies. It should be noted that the value of resistor 22 establishes the range of decibel level variation and therefore determines the low corner frequency. In commonly known compansion networks, the amount of signal preemphasis is generally limited to from 0 to 12 db providing 3 db points at 3 db and 9 db, or a 6 db range of linear attenuation. But today's recording media have sufficient quality to handle greater variations in preemphasis. That is, signal preemphasis levels up to 20 db are possible and desirable so as to increase this range of linear attenuation. The components of the signal preemphasis network 20 are selected to provide attenuation in the range of 0 db to 20 db, providing a linear range of from approximately 3 db to 17 db or a 14 db range of linear attenuation. As shown in FIG. 3, for compansion network components as valued in Tables 1 and 2, the actual high and low corner frequencies occur at approximately 3 db and 16.5 db, respectively.

The directly preemphasized signal is fed from the signal preemphasis network 20 to the compressor network 30 at the inverting input 31 of operational amplifier 32. Typically, the operational amplifier 32 will be one of two discrete amplifiers of a dual operational amplifier, the other discrete amplifier of which is utilized in the decoder and is shown as amplifier 132 in FIG. 2. The output of amplifier 32 is returned via a D.C. negative feedback loop to inverting input 31. The negative feedback loop includes series connected resistors 34 and 35 and capacitor 36 connected between resistors 34 and 35 to ground. The capacitor 36 is a low frequency filter preventing low frequency A.C. feedback to the inverting input 31 of the amplifier 32. The output of the amplifier 32 is also fed via capacitor 43, which serves as an A.C. coupler, to resistor 44 which functions as a current limiter and is series connected with a second current limiting resistor 45 to the input of a gain cell 40. The output of gain cell 40 is returned to the inverting input 31 of the amplifier 32. Thus, the gain cell functions as an A.C. feedback loop to the amplifier 32.

In order to determine the gain of the amplifier 32, the gain cell, which is a current in-current out device, responds variably to an input D.C. signal. This signal is derived by taking the output signal of the amplifier 32 and feeding it to the detection or control signal preemphasis network 50. Ideally, but not necessarily, the detection preemphasis network 50 will include a capacitor 52 which provides A.C. coupling to the detection preemphasis network 50 and also desensitizes the system to infrasonic signals. That is, capacitor 52 functions as a lowcut filter. The capacitor 52 is connected in series with capacitor 53 and resistor 54 which are connected in parallel with each other. Resistor 54 determines the low frequency 3 db point of the frequency response curve of the detection preemphasis network 50 as shown at point c in FIG. 5, and resistor 55 in combination with capacitor 53, determines the high frequency 3 db point of that curve as shown at point d of FIG. 5. The parallel connected resistor 54 and capacitor 53 are then series connected with current limiting resistor 55, which reduces the current to the rectifier 60. The components of the detection preemphasis network 50 are selected so that its attenuation of the signal it receives will be complimentary to the attenuation of the signal by the signal preemphasis network 20. This resulting signal is fed via the current limiting resistor 55 to the rectifier 60 which is a fullwave rectifier. The resulting D.C. signal is used to control the gain cell 40 which in turn determines the gain of the amplifier 32. Since the attenuation resulting in the detection preemphasis network 56 is complimentary to the attenuation of the signal preemphasis network 20, then the gain cell 40, assuming a single frequency input, varies the gain of the amplifier to produce a substantially flat frequency response output $E_{out}$. That is, as the frequency of the input signal to the signal preemphasis network 20 is increased, the amplitude of the signal appears greater to the compressor 30. But the detection preemphasis network 50, at the same frequency, provides a complimentary affect by decreasing the current in the gain cell 40, resulting in a substantially flat frequency response.

In order to eliminate the effects of harmonic distortion resulting from operation of the gain cell 40 and the effects of amplification of the noise floor during control signal decay, the buffer 71 is inserted in the D.C. control signal path between the rectifier 60 and the gain cell 40. The attack time of the D.C. control signal is limited by attack capacitor 72 and the release time of the D.C. control signal is limited by the release capacitor 73. It is known that a fast attack time will limit transient distortion while a fast release time will reduce unmasked noise. While a fast attack minimizes transient distortion, it requires a smaller integrating capacitor, which in turn causes ripple in the D.C. signal to the gain cell 20, which in turn produces harmonic distortion. Consequently, the choice of attack time is a trade-off decision. If the attack time is increased, the harmonic distortion is minimized and transient distortion is the major problem. This choice is preferrable since the transient distortion can be eliminated by the use of a limiter network 80, such as the zener diodes 81 and 82, to prevent the output from exceeding a predetermined level. Since the attack time can be delayed without negative effects, the critical choice becomes the value of the release capacitor 73 which is selected to keep the release time of the control signal at a minimum. It has been found that if capacitor 72 is then matched to capacitor 73, optimal results are achieved.

Completing the description of the compressor 30, it can be seen that its components further include a biasing input 37 to the amplifier 32, which is connected to ground via capacitor 38 to eliminate A.C. signals from the biasing input 37, and is also connected through resistor 39 to the programmable analog compandor 90 at its bias output 92. It should be noted that the analog compandor 90 used in the preferred compansion network is currently available from Signetics Company (catalogue No. NE 572) and is a dual programmable analog compandor internally biased at 2.5 volts. As is shown in FIG. 1, one discrete segment of the analog compandor 90 includes the rectifier 60, the buffer 71, and the gain cell 40, along with the current limiting resistor 45. The resistor 39 provides a path for equalizing the bias voltage of the analog compandor 90 and the biasing input 37 of the amplifier 32. The biasing voltage is controlled by a potentiometer which consists of the series connected resistor 46, variable resistor 47 and resistor 48 to a 12 volt source. Variable resistor 47 can be adjusted to balance the harmonic distortion resulting from the mismatch of internal transistors in the gain cell 40.

To complete the encoder network, the output of the amplifier 32 is filtered through capacitor 49 to block D.C. components in the output signal resulting from the D.C. bias. And, as hereinbefore mentioned, the effects of attack time transients are eliminated by the use of zener diodes 81 and 82 in the limiter network 80.

The values selected for the resistors and capacitors in the preferred encoder are as follows:

TABLE 1

| Resistor No. | K Ohms | Capacitor No. | Microfarads |
|---|---|---|---|
| 22 | 150 | 21 | 1 |
| 24 | 20 | 23 | .0022 |
| 34 | 1000 | 36 | 10 |
| 35 | 10 | 38 | 10 |
| 39 | 1 | | |
| 44 | 56.2 | 43 | 1 |
| | | 49 | 10 |
| 46 | 100 | 52 | .1 |
| 47 | 100 | 53 | .005 |
| 48 | 100 | 72 | 1 |
| | | 73 | 1 |
| 54 | 56.2 | | |
| 55 | 10 | | |

Figure 6:
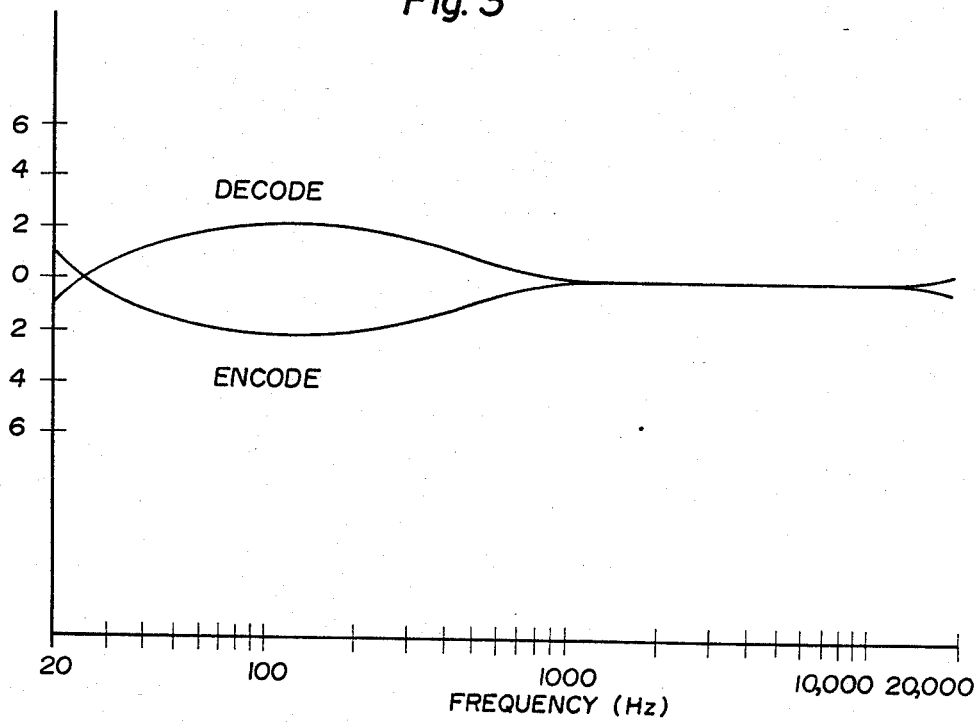
FIG. 6 illustrates the frequency response curves of the output of the encoder of FIG. 1 and the decoder of FIG. 2 for specific values of network components.

Given these values, the output signal $E_{out}$ of the encoder will have a frequency response curve which is seen to vary less than 2.5 db over the entire audio frequency range, as is shown on FIG. 6. Note that this response is shown without the effect of compression which would provide a net variation of 1.25 db.

Returning to FIG. 2, a more detailed explanation of the decoder and all of its components can now be given. The input signal $D_{in}$ to the decoder is fed to both the detection or control signal deemphasis network 150 and to the expander network 130. In the expander network 130, the signal is first filtered through capacitor 143, which serves as an A.C. coupler, to resistor 144 which functions as a current limiter and is series connected with a second current limiting resistor 145 to the input of the gain cell 140. The output of the gain cell 140 is fed to the inverting input 131 of the amplifier 132.

In order to determine the gain of the amplifier 132, the gain cell 140 responds variably to a D.C. control signal. This signal is derived from the input signal $D_{in}$ fed to the detection or control signal deemphasis network 150. This network 150 preferably includes capacitor 152, an A.C. coupler which also compensates in the deemphasis network frequency response curve for the effect of capacitor 52 in the encoder detection preemphasis network 50 frequency response curve, as is shown at x and y in FIG. 5. Capacitor 152 is connected in series with capacitor 153 and resistor 154 which are in parallel with each other. Resistor 154 determines the low frequency 3 db point of the frequency response curve of the detection deemphasis network 150, as shown at point e of FIG. 5, and resistor 155 in combination with capacitor 153 determines the high frequency 3 db point of that curve, as shown at point f of FIG. 5. The parallel connected resistor 154 and capacitor 153 are then series connected with curren limiting resistor 155 which reduces the current to the rectifier 160. The components of the detection deemphasis network 150 are selected so that its frequency response curve is the mirror image of that of the detection preemphasis network 50. The rectifier 160 is a full wave rectifier which provides the aforementioned D.C. control signal to the gain cell 140 to determine the gain of the amplifier 132. Since the response of the detection preemphasis network 50 and the detection deemphasis network 150 are mirror images, the resulting gain control signal to the gain cell 140 will vary the gain of the amplifier 132 in inverse proportion to the gain of the amplifier 32. Thus, the output of the amplifier 132 is signal expanded in inverse ratio to the compression of amplifier 32.

As in the encoder network, the signal fed from the rectifier 160 is preconditioned by a buffer 171 inserted in the D.C. control signal path between the rectifier 160 and the gain cell 140. The attack and release times are limited by attack capacitor 172 and release capacitor 173 respectively which are chosen to match the envelope created by the encoder buffer capacitors 172 and 173.

Returning to the description of the expandor network 130, the output of the gain cell 140 is fed to the inverting input 131 of the amplifier 132. The biasing input 137 of the amplifier 132 is connected to ground via capacitor 138 and through resistor 139 to the programmable analog compander 190. As hereinbefore explained, programmable analog compander 190 is a discrete segment of dual compander having compandor 90 as its other discrete segment. The output of the amplifier 132 would at this point include the effects of the encoder signal preemphasis network 20. Therefore, a feedback loop from the output of amplifier 132 to the inverting input 131 of the amplifier 132 is provided which includes the decoder signal deemphasis network 120. This network 120 includes resistor 122 connected in parallel with series connected capacitor 123 and resistor 124. Resistor 122 determines the low frequency 3 db point of the signal deemphasis network 120, as shown at point g of FIG. 4, while capacitor 123 and resistor 124 determine the high frequency 3 db point of the signal deemphasis network 120 as shown at point h of FIG. 4. The values of these components are of course chosen so that the frequency response curve of the signal deemphasis network 120 will be the mirror image of the frequency response curve of the signal preemphasis network 20, as is seen in FIG. 4. Capacitor 121 is connected in parallel across the signal deemphasis network 20 to reduce amplifier 132 gain at frequencies above the audio spectrum, and capacitor 149 filters any D.C. components in the output amplifier 132 from the decoder output $D_{out}$.

It can finally be noted that, since the frequency response curves of the decoder signal deemphasis network 120 and detector deemphasis network 150 are mirror images of the frequency response curves of the encoder signal preemphasis network 20 and detector preemphasis network 50, and the encoder networks provide an output signal $E_{out}$ with a frequency response curve which varies less than 2.5 db before compression over the entire audio frequency range, then the decoder networks will provide an output signal $D_{out}$ with a frequency response curve which varies less than 2.5 db after expansion over that range.

The values selected for the resistors and capacitors in the preferred decoder are as follows:

TABLE 2

| Resistor No. | k Ohms | Capacitor No. | Microfarads |
|---|---|---|---|
| 122 | 150 | 121 | .00003 |
| 124 | 20 | 123 | .0022 |
|  |  | 138 | 10 |
| 139 | 1 | 143 | 1 |
| 144 | 23.2 | 146 | 10 |
| 147 | 680 | 149 | 10 |
| 148 | 33 | 152 | .1 |
| 154 | 56.2 | 153 | .005 |
| 155 | 10 | 172 | 1 |
|  |  | 173 | 1 |
|  |  | 191 | 10 |

It will be apparent to those skilled in the art that many alternatives may be chosen and modifications made in the invention herein described without departing from the scope of the invention. All matter contained in this description or shown in the drawings is illustrative and not a limitation of the scope of the invention. Accordingly, it is intended that the scope of this invention includes all such alternatives and modifications as are apparent from the description or drawings or the appended claims.

What is claimed is:

1. A flat frequency response compansion noise reduction system for an input signal comprising:

means for directly preemphasizing said input signal;

means for compressing said directly preemphasized signal;

means for inversely preemphasizing said compressed signal;

means for sensing said inversely preemphasized signal and for providing a first D.C. control signal having an amplitude that varies directly with the amplitude of said inversely preemphasized signal, said compressing means being variably responsive to said first D.C. control signal to determine the gain of said compressing means;

means for directly deemphasizing said compressed signal;

means for sensing said directly deemphasized signal and for providing a second D.C. control signal having an amplitude that varies directly with the amplitude of said directly deemphasized signal;

means for expanding said compressed signal, said expanding means being variably responsive to said second D.C. control signal to determine the gain of said expanding means; and means for inversely deemphasizing said expanded signal, the frequency response curve of said means for directly preemphasizing being a mirror image of the frequency response curve of said means for inversely deemphasizing, the frequency response curve of said means for directly deemphasizing being a mirror image of the frequency response of said means for inversely preemphasizing, the high frequency 3 db point of said means for inversely preemphasizing being within the flat frequency response range of the high frequency 3 db point of said means for directly preemphasizing, and the high frequency 3 db point of said means for inversely deemphasizing being within the more sensitive frequency range of the human ear.

2. A system in accordance with claim 1 further comprising:

means for limiting the release time of said first D.C. signal; and means for limiting the release time of said second D.C. signal, said release times being substantially equal and minimized to reduce system noise, and means for limiting the attack time of said first D.C. signal; and means for limiting the attack time of said second D.C. signal, said attack times being substantially equal to said release times to reduce harmonic distortion.

3. A system in accordance with claim 1 wherein the high frequency 3 db point of said means for inversely deemphasizing is in the range of 2 kHz to 6 kHz.

4. A system in accordance with claim 3 wherein the relative energy level at the high frequency 3 db point of said means for inversely deemphasizing is in the range of 9 db to 17 db.

5. A system in accordance with claim 1 wherein the high frequency 3 db point of said means for inversely deemphasizing is substantially 3.617 kHz.

6. A system in accordance with claim 5 wherein the relative energy level at the high frequency 3 db point of said means for inversely deemphasizing is substantially 16.4 db.

7. A system in accordance with claim 5 wherein the relative frequency 3 db point of said means for inversely preemphasizing is in the range of 3.15 kHz to 3.617 kHz.

8. A method of conditioning an input signal comprising the steps of:

preemphasizing the higher frequency components of said input signal in relation to the lower frequency components of said input signal in linear logarithmic proportion to the increase in frequency over a frequency range substantially matched to the range of greatest sensitivity of the human ear;

compressing the preemphasized signal by a first gain inversely proportioned to the signal preemphasis;

expanding the compressed signal by a second gain inversely proportioned to the first gain; and deemphasizing the higher frequency components of said expanded signal in relation to the lower frequency components of said expanded signal in inverse logarithmic proportion to the increase in frequency.

9. A method in accordance with claim 8 wherein said step of compressing the preemphasized signal includes the steps of:

amplifying said preemphasized signal by a first variable gain responsive to a first D.C. control signal;

preemphasizing the lower frequency components of said amplified signal in relation to the higher frequency components of said amplified signal in complimentary relation to the preemphasis of said input signal;

sensing the amplitude of said preemphasized amplified signal; and providing said first variable D.C. control signal having an amplitude varying directly with said sensed amplitude of said preemphasized amplified signal to determine said first variable gain.

10. A method in accordance with claim 9 wherein said step of expanding the compressed signal includes the steps of:

amplifying said compressed signal by a second variable gain responsive to a second D.C. control signal;

deemphasizing the lower frequency components of said amplified compressed signal in relation to the higher frequency components of said amplified compressed signal in complimentary relation to the deemphasis of said expanded signal;

sensing the amplitude of said deemphasized amplified signal; and providing said second variable D.C. control signal having an amplitude varying directly with said sensed amplitude of said deemphasized amplified signal to determine said second variable gain.

11. A method in accordance with claim 10 further comprising the steps of buffering said first and second D.C. control signals.

12. A method in accordance with claim 11 wherein said buffering steps include the steps of:

limiting and equalizing the release times of said first and second D.C. control signals to enhance noise reduction; and equalizing the attack times of said first and second D.C. control signals to said release times to reduce harmonic distortion.

13. A method of conditioning an input signal comprising the steps of:

preemphasizing said input signal according to a direct preemphasis frequency response curve having a corner frequency substantially matched to the frequency of greatest sensitivity of the human ear;

compressing the preemphasized signal by a first gain variably responsive to a first D.C. control signal;

preemphasizing said compressed signal according to an inverse preemphasis frequency response curve which is substantially complimentary to said direct preemphasis frequency response curve;

sensing the amplitude of said inversely preemphasized signal and providing a first D.C. control signal of amplitude directly related to the amplitude of said inversely preemphasized signal to determine said first gain;

deemphasizing said compressed signal according to a direct deemphasis frequency response curve which is substantially a mirror image of said inverse preemphasis frequency response curve;

sensing the amplitude of said directly deemphasized signal and providing a second D.C. control signal of amplitude directly related to the amplitude of said directly deemphasized signal;

expanding said compressed signal by a second gain variably responsive to said second D.C. control signal; and deemphasizing said expanded signal according to an inverse deemphasis frequency response curve which is substantially a mirror image of said direct preemphasis frequency response curve.

14. A flat frequency response compansion noise reduction system for an output signal comprising:

a first single pole filter for directly preemphasizing said input signal, the frequency response curve of said first singlepole filter having a high frequency 3 db point within the more sensitive frequency range of the human ear;

a first amplifier for compressing said directly preemphasized signal;

a second single pole filter for inversely preemphasizing said compressed signal, the frequency response curve of said second single pole filter having a high frequency 3 db point within the flat frequency response range of the high frequency 3 db point of said first single pole filter;

a first full wave rectifier for sensing said inversely preemphasized signal and for providing a first D.C. control signal having an amplitude that varies directly with the amplitude of said inversely preemphasized signal, said first amplifier being variably responsive to said first D.C. control signal to determine the gain of said first amplifier a third single pole filter for directly deemphasizing said first amplified signal, the frequency response curve of said third single pole filter being a mirror image of the frequency response curve of said second single pole filter;

a second full wave rectifier for sensing said directly deemphasized signal and for providing a second D.C. control signal having an amplitude that varies directly with the amplitude of said directly deemphasized signal;

a second amplifier for expanding said first amplified signal, said second amplifier being variably responsive to said second D.C. control signal to determine the gain of said second amplifier; and a fourth single pole filter for inversely deemphasizing said second amplified signal, the frequency response curve of said fourth single pole filter being a mirror image of the frequency response curve of said first single pole filter.

* * * * *